United States Patent
Robustelli et al.

(10) Patent No.: US 11,705,199 B2
(45) Date of Patent: *Jul. 18, 2023

(54) PROGRAMMING MEMORY CELLS USING ASYMMETRIC CURRENT PULSES

(71) Applicant: Micron Technology, Inc., Boise, ID (US)

(72) Inventors: Mattia Robustelli, Milan (IT); Innocenzo Tortorelli, Cernusco Sul Naviglio (IT); Richard K. Dodge, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/567,679

(22) Filed: Jan. 3, 2022

(65) Prior Publication Data
US 2022/0122664 A1  Apr. 21, 2022

Related U.S. Application Data

(63) Continuation of application No. 16/993,795, filed on Aug. 14, 2020, now Pat. No. 11,217,308.

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 2013/0092* (2013.01)

(58) Field of Classification Search
CPC ............ G11C 13/0069; G11C 13/0004; G11C 2013/0092

USPC ........................................................ 365/163
See application file for complete search history.

(56) References Cited

U.S. PATENT DOCUMENTS

| | | | | |
|---|---|---|---|---|
| 9,171,617 B1* | 10/2015 | Park | ................... | G11C 13/0064 |
| 2008/0232163 A1 | 9/2008 | Dover | | |
| 2008/0310217 A1* | 12/2008 | Chiang | .............. | G11C 13/0038 |
| | | | | 365/163 |
| 2009/0135637 A1 | 5/2009 | Takase | | |
| 2010/0149856 A1 | 6/2010 | Tang | | |
| 2012/0057402 A1 | 3/2012 | Kim | | |
| 2013/0058164 A1 | 3/2013 | Moschiano et al. | | |
| 2016/0284403 A1 | 9/2016 | Navon | | |
| 2019/0043580 A1 | 2/2019 | Pirovano et al. | | |

(Continued)

OTHER PUBLICATIONS

International Search Report and Written Opinion from related International Patent Application No. PCT/US2021/045531, dated Nov. 23, 2021, 11 pages.

(Continued)

*Primary Examiner* — Vu A Le
(74) *Attorney, Agent, or Firm* — Brooks, Cameron & Huebsch, PLLC

(57) ABSTRACT

The present disclosure includes apparatuses and methods for programming memory cells using asymmetric current pulses. An embodiment includes a memory having a plurality of self-selecting memory cells, and circuitry configured to program a self-selecting memory cell of the memory by applying a first current pulse or a second current pulse to the self-selecting memory cell, wherein the first current pulse is applied for a longer amount of time than the second current pulse and the first current pulse has a lower amplitude than the second current pulse.

20 Claims, 7 Drawing Sheets

(56) References Cited

U.S. PATENT DOCUMENTS

2019/0378568 A1  12/2019  Robustelli
2020/0066343 A1   2/2020  Castro et al.
2020/0372955 A1  11/2020  Chen et al.

OTHER PUBLICATIONS

U.S. Appl. No. 16/729,731, entitled, "Three-State Programming of Memory Cells", filed on Dec. 30, 2019, 35 pages.
U.S. Appl. No. 16/729,787, entitled, "Multi-State Programming of Memory Cells", filed on Dec. 30, 2019, 48 pages.

* cited by examiner

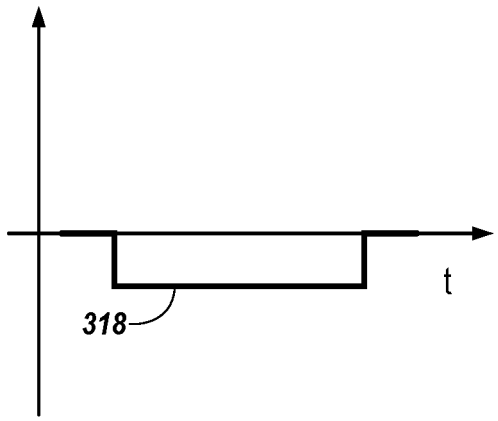 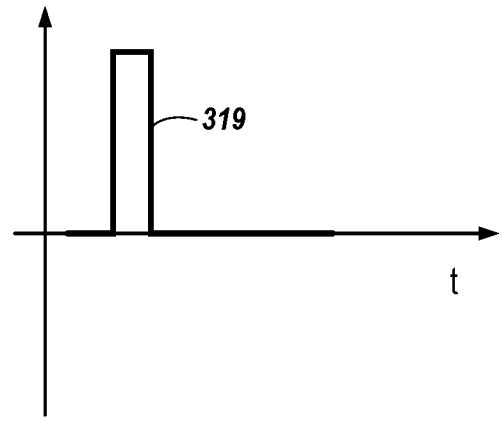
*Fig. 3A*  *Fig. 3B*
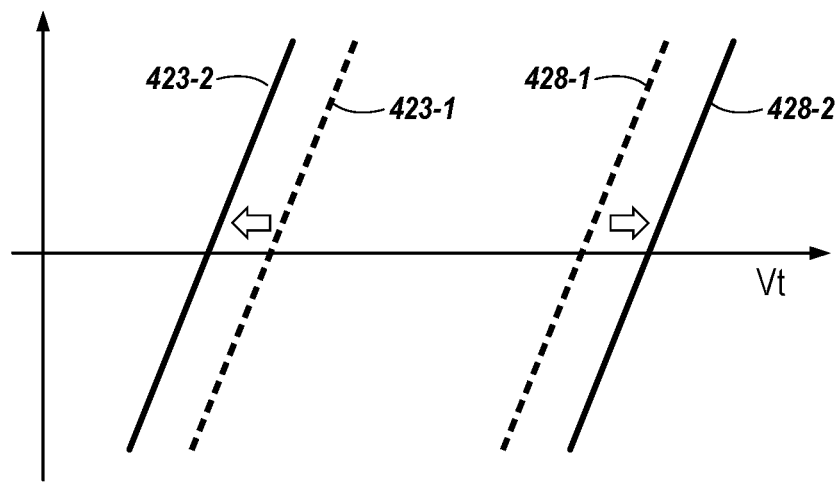
*Fig. 4*

PROGRAMMING MEMORY CELLS USING ASYMMETRIC CURRENT PULSES

PRIORITY INFORMATION

This application is a Continuation of U.S. application Ser. No. 16/993,795, filed on Aug. 14, 2020, which will issue as U.S. Pat. No. 11,217,308 on Jan. 4, 2022, the contents of which are incorporated herein by reference.

TECHNICAL FIELD

The present disclosure relates generally to semiconductor memory and methods, and more particularly, to programming memory cells using asymmetric current pulses.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of access lines and sense lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, comprise a single material which can serve as both a select element and a storage element for the memory cell.

BRIEF DESCRIPTION OF THE DRAWINGS

FIGS. 3A-3B are examples of asymmetric current pulses in accordance with an embodiment of the present disclosure.

FIG. 4 illustrates set and reset threshold voltage distributions when asymmetric set and reset current pulses are applied to a memory cell in accordance with an embodiment of the present disclosure, as compared with set and reset threshold voltage distributions when symmetric set and reset current pulses are applied to a memory cell in accordance with previous approaches.

DETAILED DESCRIPTION

Figure 1:
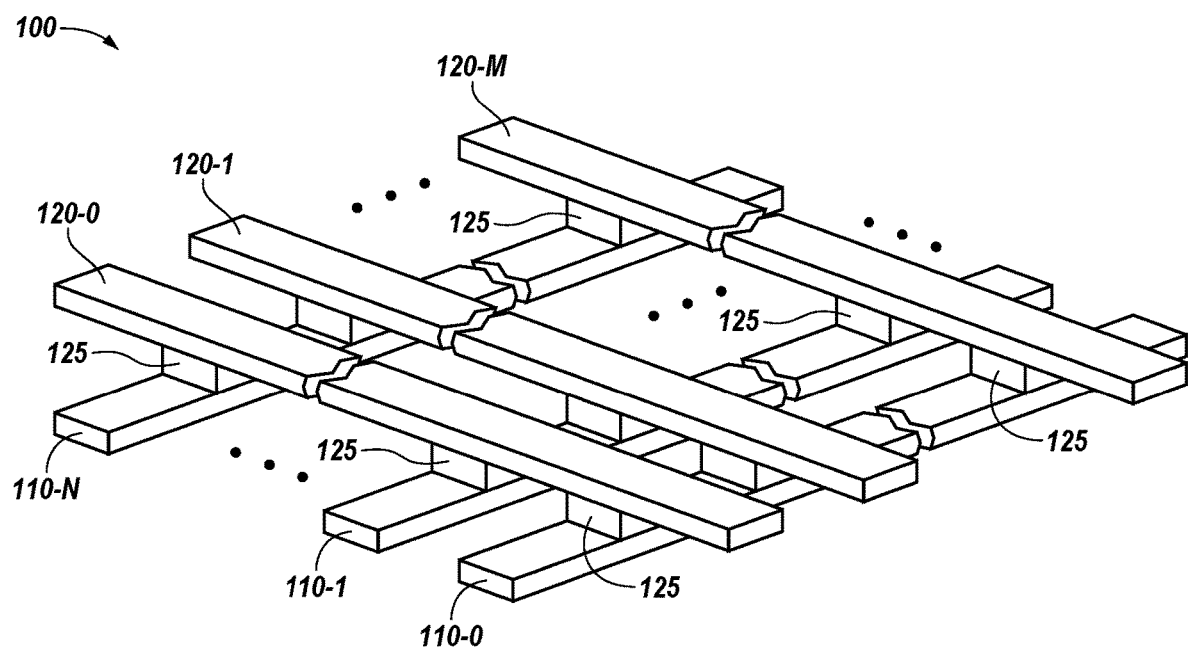
FIG. 1 is a three-dimensional view of an example of a memory array, in accordance with an embodiment of the present disclosure.

The present disclosure includes apparatuses and methods for programming memory cells using asymmetric current pulses. An embodiment includes a memory having a plurality of self-selecting memory cells, and circuitry configured to program a self-selecting memory cell of the memory by applying a first current pulse or a second current pulse to the self-selecting memory cell, wherein the first current pulse is applied for a longer amount of time than the second current pulse and the first current pulse has a lower amplitude than the second current pulse.

Embodiments of the present disclosure can provide benefits, such as increased reliability of memory cell reads and decreased read disturb, as compared to previous programming approaches. For example, previous approaches for programming memory cells, such as self-selecting memory cells, may lead to erroneous sensing (e.g., reads) of the programmed data due to the threshold voltages of the different data states (e.g., state 0 or state 1) to which the cell may be programmed being too close to each other. However, programming approaches for self-selecting memory cells in accordance with the present disclosure can increase the spacing between the threshold voltages of the different data states, and therefore increase the reliability of subsequent reads of the programmed data.

For example, such asymmetric current pulse programming can increase (e.g., by 20-30%) the spacing between the threshold voltages of the different data states to which a memory cell may be programmed in comparison to previous memory cell programming approaches. This increased spacing between the threshold voltages of the different data states may reduce the occurrence of erroneous memory cell reads.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first conductive lines, which may be referred to as access lines 110-0, 110-1, and 110-N, and a plurality second conductive lines, which may be referred to as sense lines 120-0, 120-1, and 120-M) that cross each other (e.g., intersect in different planes). For example, each of access lines 110-0 to 110-N may cross sense lines 120-0 to 120-M. A memory cell 125 may be between the sense line and the access line (e.g., at each sense line/access line crossing).

The memory cells 125 may be resistance variable memory cells, for example. The memory cells 125 may include a material programmable to different data states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

The architecture of memory array 100 may be referred to as a cross-point architecture in which a memory cell is formed at a topological cross-point between an access line and a sense line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures. In some architectures (not shown), a plurality of access lines may be formed on parallel planes or tiers parallel to a substrate. The plurality of access lines may be configured to include a plurality of holes to allow a plurality of sense lines formed orthogonally to the planes of access lines, such that each of the plurality of sense lines penetrates through a vertically aligned set of holes (e.g., the sense lines vertically disposed with respect to the planes of access lines and the horizontal substrate). Memory cells including storage element (e.g., self-selecting memory cells including a chalcogenide material) may be formed at the crossings of access lines and sense lines (e.g., spaces between the access lines and the sense lines in the vertically aligned set of holes). In a similar fashion as described above with reference to FIG. 1, the memory cells (e.g., self-selecting memory cells including a chalcogenide material) may be operated (e.g., read and/or programmed) by selecting respective conductive lines (e.g., a sense line and an access line) and applying voltage or current pulses.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

Figure 2A:
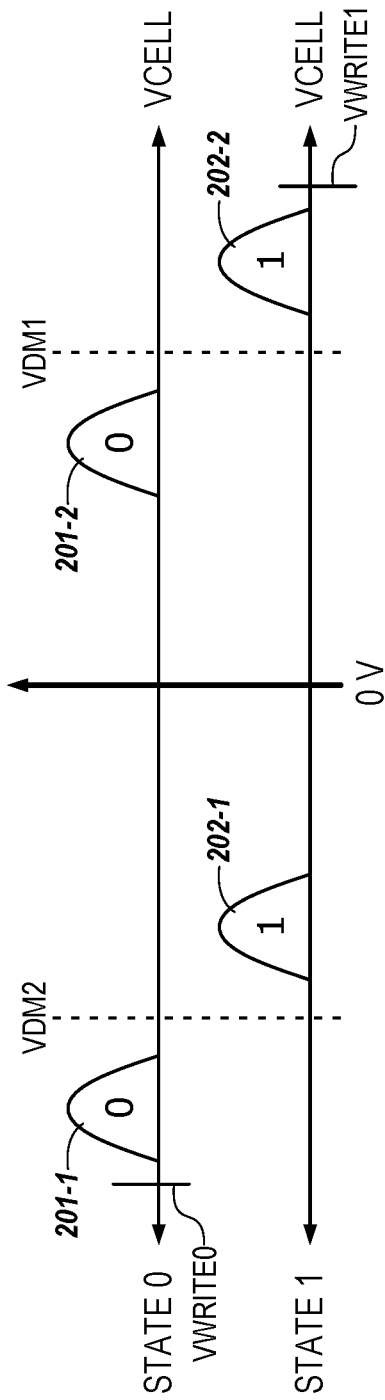
FIG. 2A illustrates threshold voltage distributions associated with memory states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a sense line voltage (e.g., bit line voltage (VBL)) and an access line voltage (word line voltage (VWL)) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
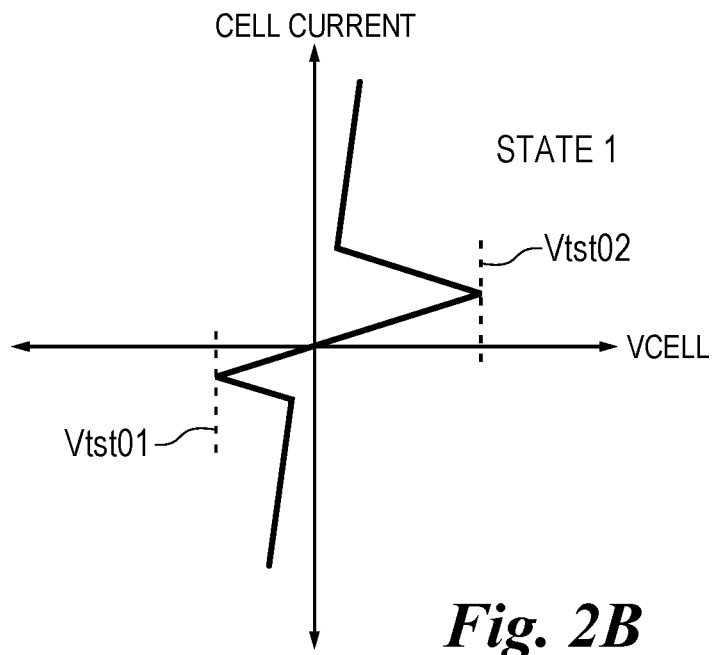
FIG. 2B is an example of a current-versus-voltage curve corresponding to a memory state of FIG. 2A, in accordance with an embodiment of the present disclosure.
Figure 2C:
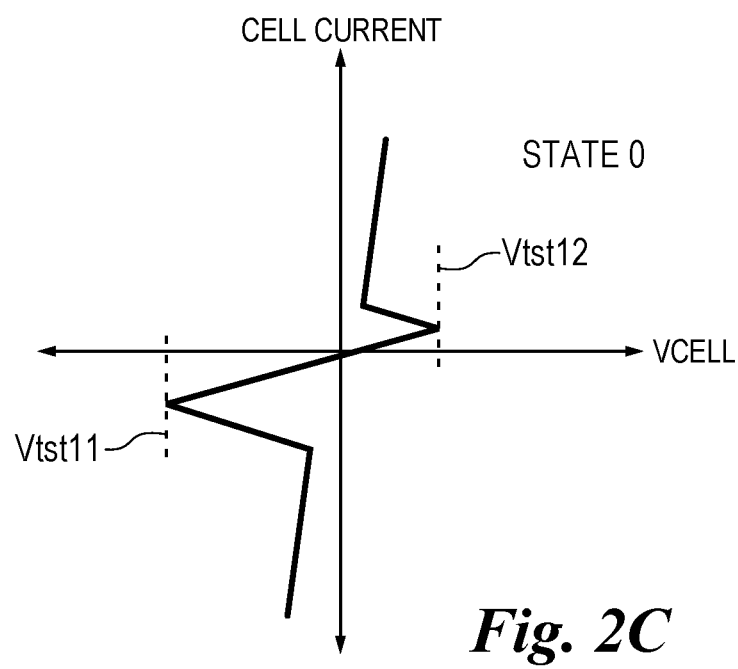
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) may be associated with a first asymmetric threshold voltage distribution (e.g., threshold voltage distributions 201-1 and 201-2) whose magnitude is greater for a negative polarity than a positive polarity, and a second data state (e.g., state 1) may be associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back may be different (e.g., higher or lower) for one applied voltage polarity than the other.

FIG. 2A illustrates demarcation voltages VDM1 and VDM2, which may be used to determine the state of a memory cell (e.g., to distinguish between states as part of a read operation). In this example, VDM1 may be a positive voltage used to distinguish cells in state 0 (e.g., in threshold voltage distribution 201-2) from cells in state 1 (e.g., threshold voltage distribution 202-2). Similarly, VDM2 may be a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 may not snap back in response to applying VDM1; a memory cell 125 in a positive state 0 may snap back in response to applying VDM1; a memory cell 125 in a negative state 1 may snap back in response to applying VDM2; and a memory cell 125 in a negative state 0 may not snap back in response to applying VDM2.

Embodiments are not limited to the example shown in FIG. 2A. For example, the designations of state 0 and state 1 may be interchanged (e.g., distributions 201-1 and 201-2 may be designated as state 1 and distributions 202-1 and 202-2 may be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C may correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL may represent an applied voltage across the memory cell. For example, VCELL may be a voltage applied to a top electrode corresponding to the cell minus a voltage applied to a bottom electrode corresponding to the cell (e.g., via a respective access line and sense line). As shown in FIG. 2B, responsive to an applied positive polarity voltage (VCELL), a memory cell programmed to state 1 (e.g., threshold voltage distribution 202-2) is in a non-conductive state until VCELL reaches voltage Vtst02, at which point the cell transitions to a conductive (e.g., lower resistance) state. This transition may be referred to as a snapback event, which occurs when the voltage applied across the cell (in a particular polarity) exceeds the cell's threshold voltage. Accordingly, voltage Vtst02 may be referred to as a snapback voltage. In FIG. 2B, voltage Vtst01 may correspond to a snapback voltage for a cell programmed to state 1 (e.g., threshold voltage distribution 202-1). That is, as shown in FIG. 2B, the memory cell may transition (e.g., switch) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) may be in a non-conductive state until VCELL reaches voltage Vtst11, at which point the cell may snap back to a conductive (e.g., lower resistance) state. In FIG. 2C, voltage Vtst12 may correspond to the snapback voltage for a cell programmed to state 0 (e.g., threshold voltage distribution 201-2). That is, as shown in FIG. 2C, the memory cell may snap back from a high impedance non-conductive state to a lower impedance conductive state when VCELL exceeds Vtst12 in the positive polarity direction.

In various instances, a snapback event may result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event may be used to write a memory cell to the opposite state (e.g., from state 1 to state 0 and vice versa).

In an embodiment of the present disclosure, a memory cell, such as memory cells 125 illustrated in FIG. 1, may be programmed to one of two possible data states (e.g., state 0 or state 1) by applying a current pulse to the memory cell. For example, the memory cell can be programmed by applying a first current pulse or a second current pulse to the cell. The first current pulse can be a pulse to be applied to the cell for a longer amount of time than the second current pulse would be applied to the cell, and/or with a lower amplitude than the second current pulse. Examples of such current pulses (e.g., asymmetric current pulses) will be further described herein (e.g., in connection with FIGS. 3A-3B).

FIGS. 3A-3B are examples of asymmetric current pulses 318 and 319 in accordance with an embodiment of the present disclosure. As used herein, asymmetric current pulses can refer to current pulses having different amplitudes (e.g., magnitudes) and/or durations. In some embodiments, FIG. 3A illustrates a current pulse 318 with a particular polarity and FIG. 3B illustrates a current pulse 319 with an opposite polarity of the current pulse 318. For example, current pulse 318 may have a negative polarity and current pulse 319 may have a positive polarity. In some embodiments, the current pulse 318 may be a set pulse and the current pulse 319 may be a reset pulse. In some embodiments, applying the current pulse 318 to the memory cell may program the memory cell to a first data state (e.g., state 0) and applying the current pulse 319 may program the memory cell to a second data state (e.g., state 1).

In some embodiments, the current pulse 318 may be applied to a self-selecting memory cell for a longer amount of time than the asymmetric current pulse 319. For example, the current pulse 318 may be applied to the memory cell for (e.g., have a duration of) at least 60 nanoseconds (ns) and the current pulse 319 may be applied to the memory cell for (e.g., have a duration of) up to 20 ns. Further, in some embodiments, the current pulse 319 may have a greater amplitude (e.g., magnitude) than current pulse 318. For example, the current pulse 318 may have an amplitude of 30 microamps (µA) and the current pulse 319 may have an amplitude of 60 µA. In some embodiments, the current pulse 318 and the current pulse 319 may be applied to the memory cell for the same amount of time and have different amplitudes. In some embodiments, the current pulse 318 and the current pulse 319 may be applied to the memory cell for different amounts of time and have a same amplitude.

Using asymmetric current pulses 318 and 319 to program a memory cell in accordance with the present disclosure can reduce the susceptibility of the cell to erroneous reads and read disturb as compared to previous programming approaches that may utilize symmetric current pulses (e.g., current pulses with the same amplitude and duration). Such erroneous reads can occur when a sensing voltage applied between two voltage distributions unintentionally reads a different voltage distribution than the voltage distribution that was intended to be read. Drift may increase the probability of an erroneous read. As used herein, the term "drift" may refer to the unintended movement of a threshold voltage distribution. Over time, the threshold voltage distribution of the memory cell in the set (e.g., low) state may drift to a higher voltage. This drift may cause the voltage distribution of the memory cell in the set state to move closer to, or past, the read voltage. This may increase the chance of an erroneous read in the memory cell due to the voltage distributions being closer together. When voltage distributions are closer together, the chance that a read voltage that is applied to detect a certain voltage distribution detecting a different voltage distribution may increase. This may result in an erroneous read in the memory cell.

As used herein, the term "read disturb" may refer to a change in the state of a memory cell caused by multiple read operations on the memory cell. In some embodiments, the effects of read disturb may change the state of a memory cell from a reset (e.g., high voltage threshold) state to a set (e.g., low voltage threshold) state after a threshold number of reads.

In some embodiments, one of the asymmetric current pulses 318 and 319 may instead be a standard current pulse. The standard pulse may be applied to the memory cell for 40 ns. Due to the standard current pulse having a different amplitude and being applied for a different amount of time than the asymmetric current pulses 318 and 319, applying either of the asymmetric pulses 318 and 319 and a standard pulse to the memory cell may increase the spacing between the threshold voltage of the memory cell in the positive and negative polarities. Applying one of the asymmetric pulses 318 and 319 to the memory cell may increase or decrease the magnitude of the threshold voltage of the memory cell while applying a standard pulse to the memory cell does not result in such an increase or decrease in the magnitude of the threshold voltage. This still increases the spacing between the threshold voltages.

FIG. 4 illustrates set and reset threshold voltage distributions when asymmetric set and reset current pulses are applied to a memory cell in accordance with an embodiment of the present disclosure, as compared with set and reset threshold voltage distributions when symmetric set and reset current pulses are applied to a memory cell in accordance with previous approaches. Threshold voltage distributions 423-1 and 423-2 (individually or collectively referred to as threshold voltage distributions 423) are threshold voltage distributions for the memory cell when a set current pulse is applied to the cell. Threshold voltage distributions 428-1 and 428-2 (individually or collectively referred to as threshold voltage distributions 428) are threshold voltage distributions for the memory cell when a reset current pulse is applied to the memory cell.

Threshold voltage distributions 423-1 and 428-1 may be the threshold voltage distributions of the memory cell in positive and negative polarities, respectively, when symmetrical current pulses are applied to the memory cell in accordance with previous approaches. As stated earlier, applying symmetrical current pulses to the memory cell may increase the probability of erroneous reads in the memory cell because of the spacing between the threshold voltage distributions of the memory cell.

In some embodiments, applying asymmetric current pulses to the memory cell may increase or decrease the magnitude of the threshold voltage distribution of the memory cell as compared to the magnitude of the threshold voltage distribution of the cell if symmetric current pulses were applied. For example, applying current pulse 318 to the memory cell may decrease the magnitude of the threshold voltage distribution 423-2 as compared to threshold voltage distribution 423-1 and applying current pulse 319 to the memory cell may increase the magnitude of the threshold voltage distribution 428-2 as compared to threshold voltage distribution 428-1. In some embodiments, current pulse 318 may yield a lower threshold voltage distribution compared to a standard pulse and therefore may be used as a set pulse. In some embodiments, current pulse 319 may yield a higher threshold voltage distribution compared to a standard pulse and therefore may be used as a reset pulse. Decreasing the magnitude of threshold voltage distribution 423-2 and increasing the magnitude of threshold voltage distribution 428-2 may increase the spacing between the threshold voltage distribution 423-2 and the threshold voltage distribution 428-2. In some embodiments, the spacing between the threshold voltage distribution 423-2 and the threshold voltage distribution 428-2 may increase by a range of approximately 20-30%.

In some embodiments, applying a current pulse (e.g., current pulse 319) for a shorter amount of time and with a higher amplitude to the memory cell may increase the resistance of the memory cell to read disturb. As mentioned in connection with FIGS. 3A-3B, read disturb may occur when multiple read operations on a memory cell unintentionally causes the memory cell to change states. Over time, the read disturb may unintentionally cause the threshold voltage distributions of the memory cells to shift and the memory cells to be programmed. Applying a reset pulse to a memory cell for a shorter amount of time and with a higher amplitude than a standard current pulse, may increase the threshold voltage distribution of the memory cell for reset pulses and increase the separation between the threshold voltage distributions of the memory cell for reset pulses and the read voltages used to read the memory cells. The increased spacing may increase the time it would take for read disturb to unintentionally program the memory cell, as well as make the reset state obtained with such a pulse inherently more resistance to read disturb.

Figure 5:
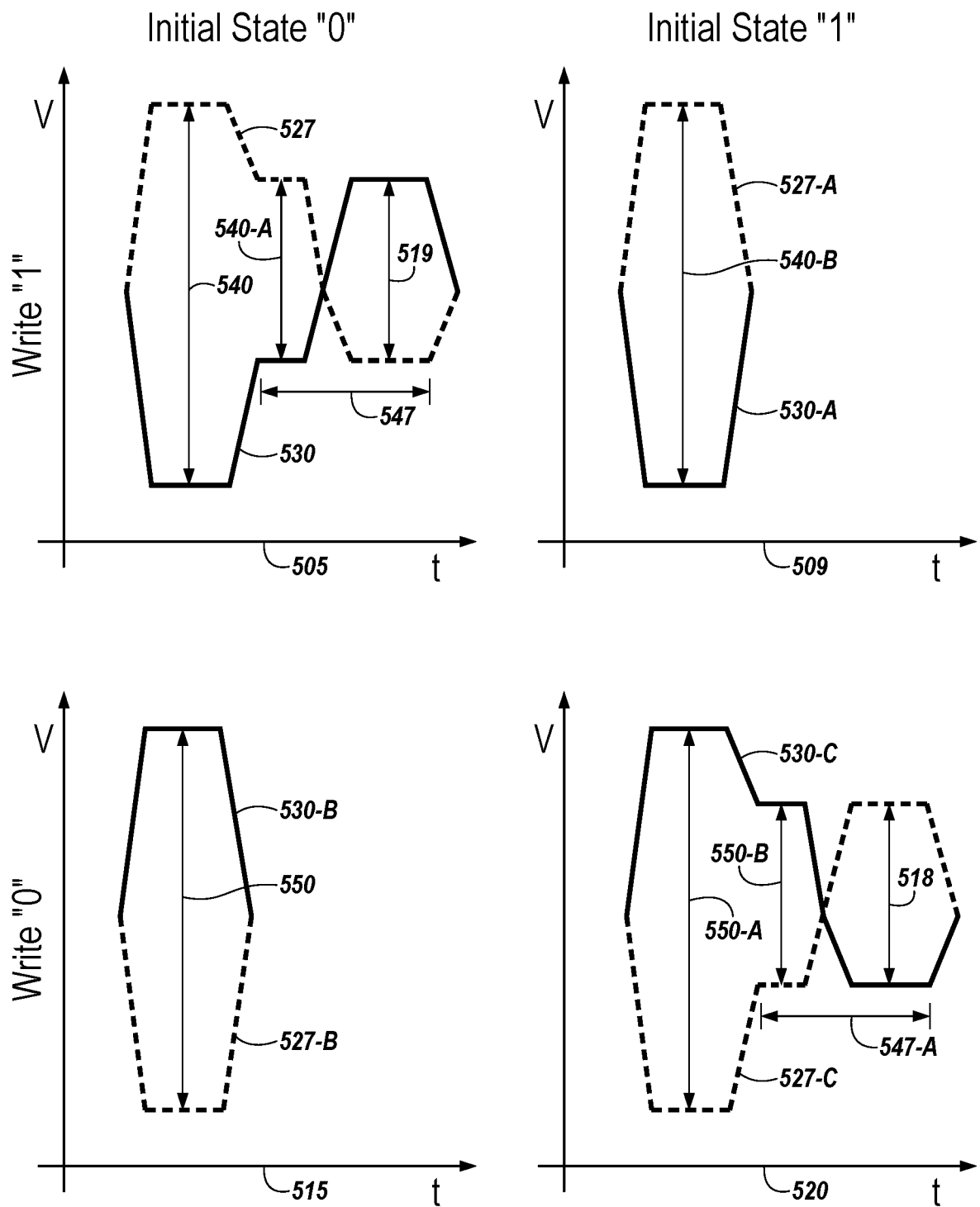
FIG. 5 illustrates examples of timing diagrams associated with distributions of threshold voltages in accordance with an embodiment of the present disclosure.

FIG. 5 illustrates examples of timing diagrams associated with distributions of threshold voltages in accordance with an embodiment of the present disclosure. A self-selecting memory cell may be configured to store a particular data state based on one or more current pulses applied to the memory cell. The voltage distributions depict data states that may be stored in a self-selecting memory cell.

The self-selecting memory cell may include a chalcogenide material. The self-selecting memory cells may be able to function as described herein due to the properties of the chalcogenide material. The chalcogenide material included in the current disclosure may function differently than the chalcogenide material in other types of memory. For example, the chalcogenide material in other types of memory may change its phase to program a memory cell to different data states. However, the chalcogenide material of the present disclosure may program the self-selecting memory cell to different data states without changing its phase.

The threshold voltage distributions may represent various data states of a memory cell during a write operation. In the example of FIG. 5, the timing diagram 505 may represent writing a second data state (e.g., a logic "1") to a memory cell that stores a first data state (e.g., a logic "0"). Timing diagram 509 may represent a write operation where a memory cell stores a same data state (e.g., a logic "1") as the data state desired from a write operation (e.g., a logic "1"). Timing diagram 515 may represent a write operation where a memory cell stores a same data state (e.g., a logic "0") as the data state desired from a write operation (e.g., a logic "0"). Timing diagram 520 may represent writing a second data state (e.g., a logic "0") to a memory cell that stores a first data state (e.g., a logic "1").

Timing diagram 505 may depict a write operation of a memory cell (e.g., of a self-selecting memory cell). Timing diagram 505 may show the voltage 540, which may be referred to as second current pulse 540, and voltage 519 (e.g., VHOLD), which may be referred to as third current pulse 519. Timing diagram 505 may also depict the voltage 527 of a conductive line and the voltage 530 of a conductive line. Accordingly, to conduct a write operation on a memory cell, a current pulse 527 may be applied to one conductive line and an additional pulse 530 may subsequently be applied to a second conductive line.

A memory cell associated with timing diagram 505 may store a first data state (e.g., a logic "0"). A second current pulse 540 may be applied to the memory cell to write a second data state (e.g., a logic "1") to the memory cell. The second current pulse 540 may be configured such that a snapback event occurs if the memory cell stores a first data state but that no snapback event occurs if the memory cell stores a second data state different than the first data state. Accordingly, second current pulse 540 may be applied to the cell with a second polarity.

After applying the second current pulse 540, a snapback event may occur which may be characterized by the threshold voltage distribution of the memory cell being reduced. In some examples the snapback event may be determined by a memory controller. The snapback event may cause the threshold voltage associated with the memory cell to be reduced. In some cases, the snapback event may cause the magnitude of the second current pulse 540 to be reduced, as shown by the reduced second current pulse 540-A.

A snapback event may occur for a fixed duration and may be followed by a period in which the memory cell is maintained in a higher conductance state (e.g., duration 547). This high conductance state may be referred to as a selection time. Thus, to write a second data value (e.g., a logic "1") to the memory cell, a third current pulse 519 may be applied. In some embodiments, the third current pulse 519 may be similar to the reduced second current pulse 540-A, but with an opposite polarity. To reverse the polarity, the voltages applied to the access line and the sense line may be switched. The third current pulse 519 may be applied to the memory cell with an opposite polarity than the second current pulse 540. In some embodiments, applying the third current pulse 519 may program the memory cell to an opposite data state than the data state the memory cell is currently programmed to. For example, applying the third current pulse 519 during the selection time (e.g., during duration 547) may program a second data state (e.g., a logic "1") to the memory cell using a different (e.g., increased or reduced) voltage as compared to some write operations. In some embodiments, the second current pulse 540 and the third current pulse 519 may be applied for a same amount of time and have different amplitudes. In other embodiments, the second current pulse 540 and the third current pulse 519 may be applied to the memory cell for different amounts of time and have a same amplitude. Applying a first current pulse (e.g., current pulse 550 described later in connection with timing diagrams 515 and 520) and the second current pulse 540 at lower voltages may optimize the use of the memory cell, such as reducing the stress on the memory cell and reducing the power consumption of the memory array associated with the memory cell.

In some examples, the third current pulse 519 may not be applied during the selection time (e.g., duration 547). Accordingly, a threshold voltage of the memory cell may increase to its original level. For example, in the context of timing diagram 505, if third current pulse 519 is not applied during duration 547, a threshold voltage of the memory cell may increase to the voltage value depicted prior to duration 547. If the third current pulse 519 is applied after the duration 547, for example, the magnitude of the third current pulse 519 may be greater than or equal to the magnitude of the second current pulse 540 to achieve the same result of writing the data state to the memory cell. In some examples, the memory cell may be selected after duration 547 by applying a voltage lower than the original threshold voltage of the memory cell. For example, a threshold refresh operation may occur by selecting the memory cell after duration 547 in either polarity without completing the write operation. Because the threshold recovery time of the memory cell may be large (e.g., relative to duration 547) after duration 547, the memory cell may be deselected (e.g., by applying a same voltage to the access line and to the sense line of the memory cell). When deselected, additional snapback events or other array operations may be conducted on other portions of the memory array before completing the write operation depicted by timing diagram 505. This may enable more efficient writes by effectively grouping together multiple cells for some phases of the write operation.

In some embodiments, a fourth current pulse (not pictured) may be applied to the memory cell. The fourth current pulse may have an opposite polarity than the third current pulse 519. In some embodiments, the third current pulse 519 and the fourth current pulse may be applied for the same amount of time and have different amplitudes. In some embodiments, the third current pulse 519 and the fourth current pulse may be applied for different amounts of time and have a same amplitude.

Timing diagram 509 may depict a portion of a write operation of a memory cell (e.g., of a self-selecting memory cell). Timing diagram 509 may show a second current pulse 540-B being applied to the memory cell. Timing diagram 509 may also depict the voltage 527-A of a conductive line, and the voltage 530-A of a conductive line.

A memory cell associated with timing diagram 509 may store a data state (e.g., a logic "1"). A second current pulse 540-B may be applied to the memory cell to write a data state (e.g., a logic "1") to the memory cell. Accordingly, second current pulse 540-B may be applied to the cell with a first polarity.

As described above, when a memory cell stores a first data state (e.g., a logic "0"), a snapback event may occur when writing a second data state (e.g., a logic "1") to the memory cell. However, when writing (e.g., attempting to write) a same data state to a memory cell as the memory cell currently stores, a snapback event may not occur. For example, when a memory cell stores a logic "1," and a logic "1" is attempted to be written to the same cell, a snapback event may not occur. Accordingly, as illustrated in timing diagram 509, a snapback event may not occur and the write operation (e.g., the attempted write operation) may be complete. The lack of an occurrence of the snapback event may be detected by not seeing a reduction in the magnitude of the second current pulse 540-B. If no snapback is detected, the polarity of the programming pulse is not reversed as is shown in timing diagram 505.

Timing diagram 515 may depict a portion of a write operation of a memory cell (e.g., of a self-selecting memory cell). Timing diagram 515 may show a first current pulse 550 being applied to the memory cell. Timing diagram 515 may also depict the voltage 530-B of a conductive line, and the voltage 527-B of a conductive line.

A memory cell associated with timing diagram 515 may store a data state (e.g., a logic "0"). A first current pulse 550 may be applied to the memory cell to write a data state (e.g., a logic "0") to the memory cell. Accordingly, first current pulse current 550 may be applied to the memory cell with a first polarity. As described above, when a memory cell stores a first data state (e.g., a logic "1"), a snapback event may occur when writing a second data state (e.g., a logic "0") to the memory cell.

However, when writing (e.g., attempting to write) a same data state to a memory cell as the memory cell currently stores, a snapback event may not occur. For example, when a memory cell stores a logic "0," and a logic "0" is attempted to be written to the same cell, a snapback event may not occur. Accordingly, as illustrated in timing diagram 515, a snapback event may not occur and the write operation (e.g., the attempted write operation) may be complete. The lack of an occurrence of the snapback event may be detected by not seeing a reduction in the magnitude of the first current pulse 550. If no snapback is detected, the polarity of the programming pulse may not be reversed as is shown in timing diagram 505.

Timing diagram 520 may depict a write operation of a memory cell (e.g., of a self-selecting memory cell). Timing diagram 520 may show voltage 550-A, which may be referred to as first current pulse 550-A, and voltage 518 (e.g., VHOLD), which may be referred to as third current pulse 518. Timing diagram 520 may also depict the voltage 530-C of a conductive line, and the voltage 527-C of a second conductive line. Accordingly, to conduct a write operation on a memory cell, a first pulse 550-A may be applied to one access line and a third pulse 518 may subsequently be applied to a second access line.

A memory cell associated with timing diagram 520 may store a first data state (e.g., a logic "1"). A first current pulse 550-A may be applied to the memory cell to write a second data state (e.g., a logic "0") to the memory cell. The first current pulse 550-A may be configured such that a snapback event occurs if the memory cell stores a first data state but that no snapback event occurs if the memory cell stores a second data state different than the first data state. Accordingly, first pulse 550-A may be applied to the memory cell with a first polarity.

After applying the first pulse, a snapback event may occur which may be characterized by the threshold voltage distribution of the memory cell being reduced. In some examples the snapback event may be determined by a memory controller. The snapback event may cause the threshold voltage associated with the memory cell to be reduced. In some cases, the snapback event may cause the magnitude of the first pulse to be reduced, as shown by the first current pulse 550-B.

A snapback event may occur for a fixed duration and may be followed by a period in which the memory cell is maintained in a higher conductance state (e.g., duration 547-A). This high conductance state may be referred to as a selection time. Thus, a third current pulse 518 may be applied to write a second data value (e.g., a logic "0") to the memory cell. In some cases, the third current pulse 518 may be similar to the first current pulse 550-A, but with an opposite polarity. To reverse the polarity, the voltages applied to the access line and the sense line may be switched. The third current pulse 518 may be applied to the memory cell with an opposite polarity. In some embodiments, applying the third current pulse 518 to the memory cell may program the memory cell to an opposite data state of the data state the memory cell is currently programmed. A second data state (e.g., a logic "0") may be written to the memory cell using a different (e.g., increased or reduced) voltage as compared to some write operations by applying the third current pulse 518 during the selection time (e.g., during duration 547-A). Applying the first current pulse 550-A and the second pulse 540 at lower voltages may optimize the use of the memory cell, such as reducing the stress on the memory cell and reducing the power consumption of the memory array associated with the memory cell.

In some embodiments, the third current pulse 518 may not be applied during the selection time (e.g., duration 547-A). Accordingly, a threshold voltage of the memory cell may increase to its original level. For example, in the context of timing diagram 520, if the third current pulse 518 is not applied during duration 547-A, a threshold voltage of the memory cell may increase to the voltage value depicted prior to duration 547-A. If the third current pulse 518 is applied after the duration 547-A, the magnitude of the third current pulse 518 may be greater than or equal to the magnitude of the first current pulse 550-A to achieve the same result of writing the data state to the memory cell.

In some embodiments, a fourth current pulse (not pictured) may be applied to the memory cell. The fourth current pulse may have an opposite polarity than the third current pulse 518. In some embodiments, the third current pulse 518 and the fourth current pulse may be applied for the same amount of time and have different amplitudes. In some embodiments, the third current pulse 518 and the fourth current pulse may be applied for different amounts of time and have a same amplitude.

Figure 6:
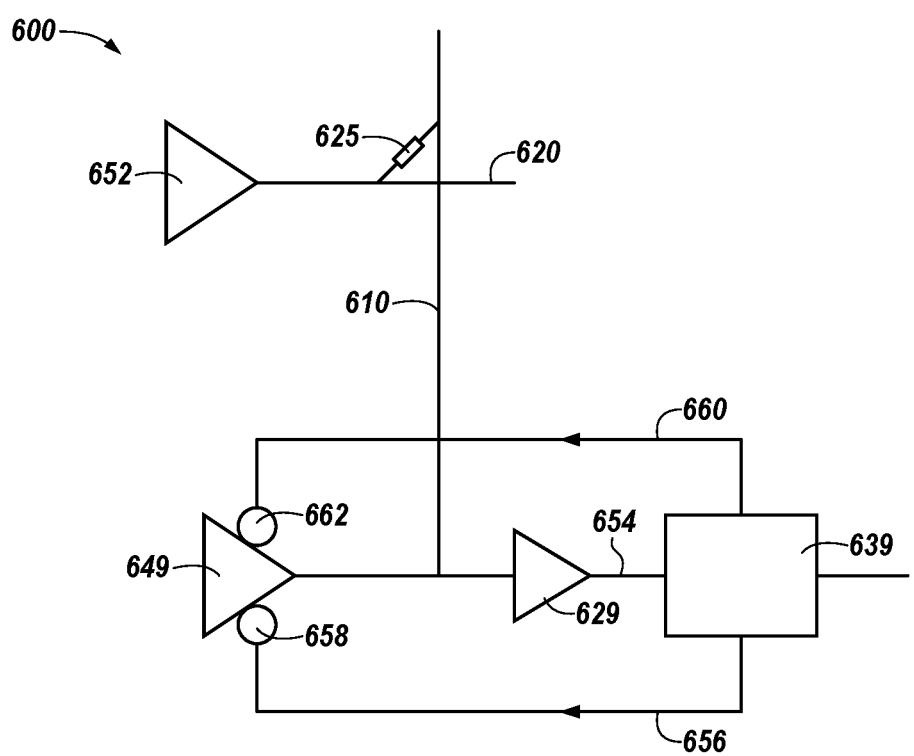
FIG. 6 illustrates an example of a portion of a memory array and associated circuitry in accordance with an embodiment of the present disclosure.

FIG. 6 illustrates an example of a portion of a memory array 600 and associated circuitry for detecting snapback events in accordance with an embodiment of the present disclosure. Memory array 600 may be a portion of memory array 100 previously described in connection with FIG. 1. Memory cell 625 may be coupled to an access line 610 and a sense line 620 and may be operated as described herein.

The example shown in FIG. 6 includes a driver 649 (e.g., an access line driver 649) coupled to access line 610. Access line driver 649 may supply bi-polar (e.g., positive and negative) current and/or voltage signals to access line 610. A sense amplifier 629, which may comprise a cross-coupled latch, may be coupled to access line driver 649, and may detect positive and negative currents and/or positive and negative voltages on access line 610. In some examples, sense amplifier 629 may be part of (e.g., included in) access line driver 649. For example, the access line driver 649 may include the sensing functionality of sense amplifier 629. A sense line driver 652 may be coupled to sense line 620 to supply positive and/or negative current and/or voltage signals to sense line 620.

The sense amplifier 629 and access line driver 649 may be coupled to a latch 639, which may be used to store a data value indicating whether or not a snapback event of cell 625 has occurred responsive to an applied voltage differential. For instance, an output signal 654 of sense amplifier 629 may be coupled to latch 639 such that responsive to detection, via sense amplifier 629, of memory cell 625 snapping back, the output signal 654 may cause the appropriate data value to be latched in latch 639 (e.g., a data value of "1" or "0" depending on which data value is used to indicate a detected snapback event). For example, if a latched data value of "1" is used to indicate a detected snapback event, then signal 654 may latch 639 to latch a data value of logical 1 responsive to a detected snapback of cell 625, and vice versa.

When a positive voltage differential VDM1 is applied to memory cell 625 (e.g., the word line voltage VWL1 is low and the bit line voltage VBL1 is high) and memory cell 625 stores state 0, voltage differential VDM1 may be greater than the threshold voltage Vtst12. Further, memory cell 625 may snap back to a conductive state, causing the positive current flow, shown in FIG. 2C, through memory cell 625 from sense line 620 to access line 610. Sense amplifier 629 may detect this current, and/or a voltage associated therewith, for example, and may output signal 654 to latch 639 in response to detecting this current and/or voltage. For example, signal 654 may indicate to latch 639 (e.g., by having a logical high value) that the current is positive, and thus that the access line voltage is high. In response to the signal 654 indicating that the word line voltage is high, latch 639 may output a signal 656 (e.g. voltage) to circuitry 658 of, or coupled to, access line driver 649 that turns off (e.g., inhibits) the current flow through access line 610, and thus through memory cell 625.

In some embodiments, when a negative voltage differential VDM2 is applied to memory cell 625 (e.g., the access line voltage VWL2 is high and the sense line voltage VBL2 is low) and memory cell 625 stores state 1, voltage differential VDM2 may be greater (in a negative sense) than the threshold voltage Vtst01 (FIG. 2B). Further, memory cell 625 may snap back to a conductive state, causing the negative current flow, shown in FIG. 2B, through memory cell 625 from access line 610 to sense line 620. Sense amplifier 629 may detect this current, and/or a voltage associated therewith, for example, and may output the signal 654 to latch 639 in response to detecting this current and/or a voltage. For example, signal 654 may indicate to latch 639 that the current is negative (e.g., by having a logical low value), and thus that the access line voltage is low. In response to the signal 654 indicating that the access line voltage is low, latch 639 may output a signal 660 (e.g. voltage) to circuitry 662 of, or coupled to, access line driver 649 that turns off the current flow through access line 610. In some embodiments, sense amplifier 629, in combination with circuitries 658 and 662, may be referred to as detection circuitry.

Figure 7:
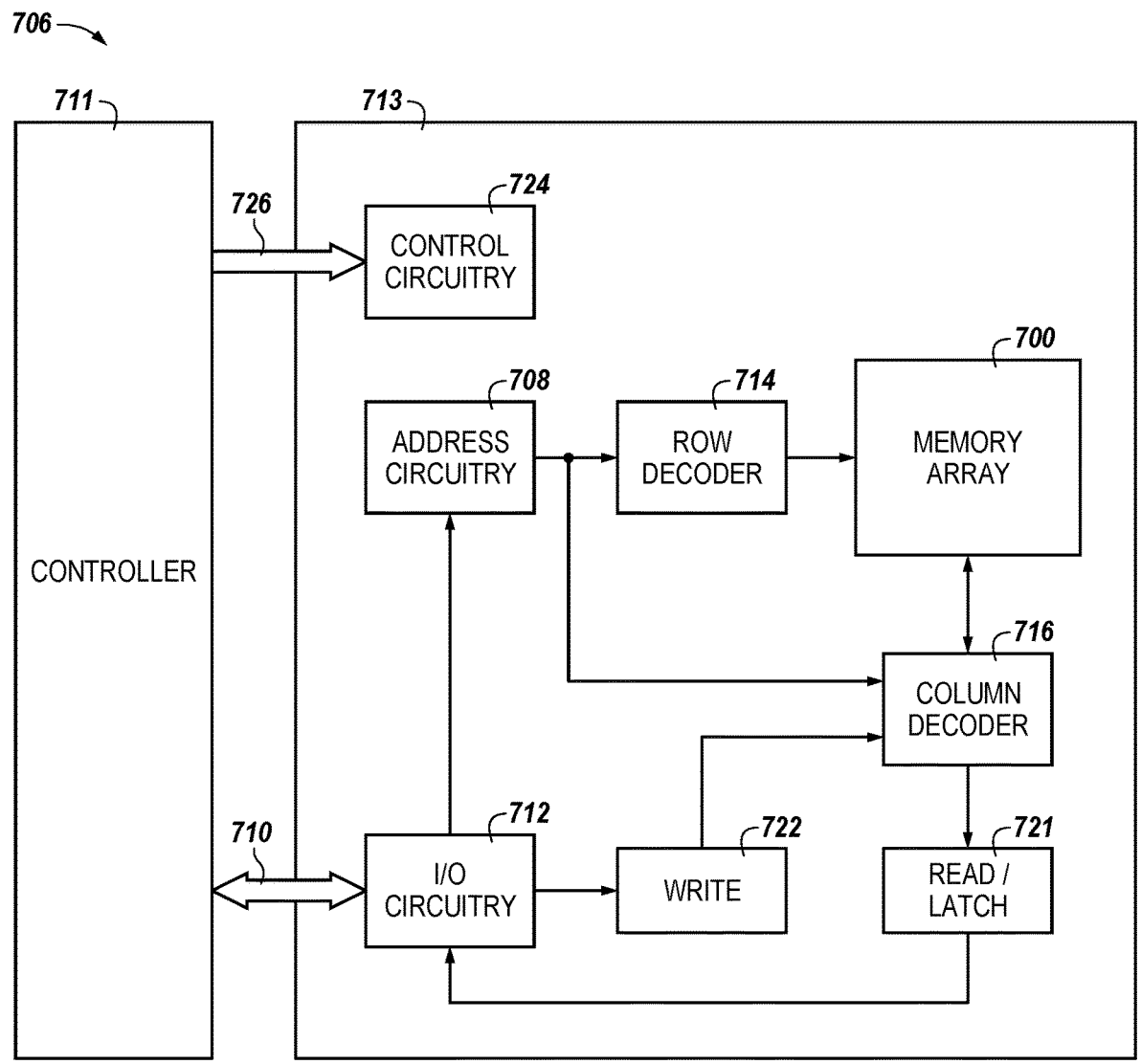
FIG. 7 is a block diagram illustration of an example apparatus in accordance with an embodiment of the present disclosure.

FIG. 7 is a block diagram illustration of an example apparatus, such as an electronic memory system 706, in accordance with an embodiment of the present disclosure. Memory system 706 may include an apparatus, such as a memory device 713, and a controller 711, such as a memory controller (e.g., a host controller). Controller 711 may include a processor, for example. Controller 711 may be coupled to a host, for example, and may receive command signals (or commands), address signals (or addresses), and data signals (or data) from the host and may output data to the host.

Memory device 713 may include a memory array 700 of memory cells. For example, memory array 700 may include one or more of the memory arrays, such as a cross-point array, of memory cells disclosed herein.

Memory device 713 may include address circuitry 708 to latch address signals provided over I/O connections 710 through I/O circuitry 712. Address signals may be received and decoded by a row decoder 714 and a column decoder 716 to access the memory array 700. For example, row decoder 714 and/or column decoder 716 may include drivers, such as drivers 649, as previously described in conjunction with FIG. 6.

Memory device 713 may sense (e.g., read) data in memory array 700 by sensing voltage and/or current changes in the memory array columns using sense/buffer circuitry that in some examples may be read/latch circuitry 721. Read/latch circuitry 721 may read and latch data from the memory array 700. I/O circuitry 712 may be included for bi-directional data communication over the I/O connections 710 with controller 711. Write circuitry 722 may be included to write data to memory array 700.

Control circuitry 724 may decode signals provided by control connections 726 from controller 711. These signals may include chip signals, write enable signals, and address latch signals that are used to control the operations on memory array 700, including data read and data write operations.

Control circuitry 724 may be included in controller 711, for example. Controller 711 may include other circuitry, firmware, software, or the like, whether alone or in combination. Controller 711 may be an external controller (e.g., in a separate die from the memory array 700, whether wholly or in part) or an internal controller (e.g., included in a same die as the memory array 700). For example, an internal controller might be a state machine or a memory sequencer.

In some examples, controller 711 may be configured to cause memory device 713 to at least perform the methods disclosed herein, such as programming the memory cells of array 700 using asymmetric current pulses. In some examples, memory device 713 may include the circuitry previously described in conjunction with FIG. 6. For example, memory device 713 may include the sense amplifier circuitry and latches, such as sense amplifier 629 and latch 639, disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 706 of FIG. 7 has been simplified. It should be recognized that the functionality of the various block components described with reference to FIG. 7 may not necessarily be segregated to distinct components or component portions of an integrated circuit device. For example, a single component or component portion of an integrated circuit device could be adapted to perform the functionality of more than one block component of FIG. 7. Alternatively, one or more components or component portions of an integrated circuit device could be combined to perform the functionality of a single block component of FIG. 7.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells; and
circuitry configured to program a memory cell of the memory by:
applying a first current pulse or a second current pulse to the memory cell, wherein the first current pulse and the second current pulse have different amplitudes or different durations; and
applying a third current pulse and a fourth current pulse to the memory cell.

2. The apparatus of claim 1, wherein the first current pulse has a longer duration than the second current pulse.

3. The apparatus of claim 1, wherein the first current pulse has a lower amplitude than the second current pulse.

4. The apparatus of claim 1, wherein the memory cell changes from a first data state to a second data state during a snapback event in response to the second current pulse being applied to the memory cell.

5. The apparatus of claim 4, wherein a magnitude of a threshold voltage that causes the snapback event when the second current pulse is applied to the memory cell depends on a data state of the memory cell.

6. The apparatus of claim 4, wherein the memory cell is in a state of high conductance after the snapback event occurs.

7. The apparatus of claim 6, wherein a threshold voltage of the memory cell decreases while the memory cell is in the state of high conductance.

8. The apparatus of claim 6, wherein an amplitude of the third current pulse when the memory cell is in the state of high conductance is lower than the amplitude of the third current pulse when the memory cell is not in the state of high conductance.

9. The apparatus of claim 6, wherein an amplitude of the second current pulse is reduced when the memory cell is in the state of high conductance.

10. The apparatus of claim 6, wherein an amplitude of the third current pulse is greater than or equal to an amplitude of the first current pulse when the memory cell is not in the state of high conductance.

11. An apparatus, comprising:
a memory having a plurality of memory cells; and
circuitry configured to program a memory cell of the memory by:
applying a first current pulse, or a second current pulse to the memory cell, wherein:
the second current pulse is applied for a shorter amount of time than the first current pulse; or
the second current pulse has a greater amplitude than the first current pulse; and
applying a third current pulse and a fourth current pulse to the memory cell.

12. The apparatus of claim 11, wherein the second current pulse has an opposite polarity than the first current pulse.

13. The apparatus of claim 11, wherein the third current pulse has an opposite polarity of the first current pulse when the first current pulse is applied to the memory cell.

14. The apparatus of claim 11, wherein the third current pulse has an opposite polarity of the second current pulse when the second pulse is applied to the memory cell.

15. The apparatus of claim 11, wherein the fourth current pulse has an opposite polarity of the third current pulse.

16. A method, comprising:
programming a memory cell by:
applying a first current pulse to the memory cell or applying a second current pulse to the memory cell, wherein the first current pulse and the second current pulse have different amplitudes or different durations; and
applying a third current pulse and a fourth current pulse to the memory cell.

17. The method of claim 16, wherein applying the first current pulse to the memory cell programs the memory cell to a first data state.

18. The method of claim 17, wherein applying the third current pulse to the memory cell programs the memory cell to a second data state after the memory cell is programmed to the first data state.

19. The method of claim 16, wherein applying the second current pulse to the memory cell programs the memory cell to a second data state.

20. The method of claim 19, wherein applying the third current pulse to the memory cell programs the memory cell to the first data state after the memory cell is programmed to the second data state.

* * * * *